United States Patent
Yao

(10) Patent No.: US 10,043,899 B1
(45) Date of Patent: Aug. 7, 2018

(54) LATERALLY DIFFUSED MOSFET FOR EMBEDDED MEMORY APPLICATIONS

(71) Applicant: SEMICONDUCTOR COMPONENTS INDUSTRIES, LLC, Phoenix, AZ (US)

(72) Inventor: Thierry Yao, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/632,997

(22) Filed: Jun. 26, 2017

(51) Int. Cl.
*H01L 29/78* (2006.01)
*H01L 29/08* (2006.01)
*H01L 27/115* (2017.01)

(52) U.S. Cl.
CPC ........ *H01L 29/7823* (2013.01); *H01L 27/115* (2013.01); *H01L 29/0886* (2013.01)

(58) Field of Classification Search
CPC ........................ H01L 29/0873–29/0886; H01L 29/66681–29/66704; H01L 29/7816–29/7826; H01L 29/7833–29/7836
See application file for complete search history.

(56) References Cited

U.S. PATENT DOCUMENTS

| | | | |
|---|---|---|---|
| 2005/0106791 A1* | 5/2005 | You | H01L 21/823814 438/197 |
| 2005/0236666 A1 | 10/2005 | Wang | |
| 2006/0001050 A1 | 1/2006 | Wang et al. | |
| 2007/0120187 A1* | 5/2007 | Udrea | H01L 29/0653 257/347 |

* cited by examiner

*Primary Examiner* — Tucker J Wright
(74) *Attorney, Agent, or Firm* — Ramey & Schwaller, LLP

(57) ABSTRACT

A Laterally Diffused MOSFET (LDMOS) device architecture particularly suitable for use in tight pitch environments such as for line drivers in an integrated memory application. In one embodiment, an illustrative high-voltage MOSFET device includes: a body (a semiconductor of a first conductivity type), a source region (a semiconductor of a second conductivity type) at a source active area and positioned within or adjacent to the body, a drift region (a lightly-doped semiconductor of the second conductivity type) positioned adjacent to the body, and a gate overlying at least a portion of the body and at least a portion of the drift region to form a controllable channel between the source region and the drift region. To increase the drain breakdown voltage, a width dimension of the drift region is formed to be sufficiently small for a depletion zone to extend across a full width of the drift region.

16 Claims, 5 Drawing Sheets

US 10,043,899 B1

LATERALLY DIFFUSED MOSFET FOR EMBEDDED MEMORY APPLICATIONS

BACKGROUND

Metal-oxide-semiconductor field effect transistors (MOSFETs) are semiconductor devices commonly employed for switching power on and off. A MOSFET includes a source region, a drain region, and a body extending between the source and drain regions. The body is separated from a gate electrode by a thin dielectric layer, so that a voltage applied to the gate electrode can control whether a conductive channel forms between the source and the drain regions. When the gate voltage is applied and the conductive channel is formed, the MOSFET enables current to pass through the device (between the drain and source regions), subject to an on-state resistance. When the conductive channel is absent, the device blocks current flow unless a drain breakdown voltage is reached.

It is desirable to make on-state resistance as small as possible while making the drain breakdown voltage as high as possible, but traditionally these parameters have had to be traded-off against each other. This trade-off constraint has been relaxed (though not eliminated) through the use of so-called Laterally Diffused MOSFET (LDMOS) devices. Such devices employ light doping on the drain side to provide in a wide depletion layer with high blocking voltage. But the depletion layer also extends laterally from the devices, which must then be spaced further apart to preserve the breakdown voltage. This spacing requirement limits the utility of such devices in tight-pitch environments such as embedded memory.

SUMMARY

Accordingly, there is disclosed herein a Laterally Diffused MOSFET (LDMOS) device architecture particularly suitable for use in tight pitch environments such as for line drivers in an integrated memory application. In one embodiment, an illustrative high-voltage MOSFET device includes: a body (a semiconductor of a first conductivity type), a source region (a semiconductor of a second conductivity type) at a source active area and positioned within or adjacent to the body, a drift region (a lightly-doped semiconductor of the second conductivity type) positioned adjacent to the body, and a gate overlying at least a portion of the body and at least a portion of the drift region to form a controllable channel between the source region and the drift region. The portion of the drift region overlaid by the gate is bordered by semiconducting material forming a depletion zone with a reverse-biased PN junction when the controllable channel is off. To increase the drain breakdown voltage, a width dimension of the drift region is formed to be sufficiently small for a depletion zone to extend across a full width of the drift region.

In one embodiment, an illustrative memory device includes a memory array having a cell pitch, and a side-by-side array of high-voltage drivers arranged along one side of the memory array at no more than twice the cell pitch. Each of the high-voltage drivers includes, in a semiconductor bulk of a first conductivity type: a moderately-doped area of the first conductivity type to serve as a body; a source region at a source active area, the source region being a semiconductor of a second conductivity type and positioned within or adjacent to the body; a drift region being a lightly-doped semiconductor of the second conductivity type, the drift region positioned adjacent to the body; and a gate overlying at least a portion of the body and at least a portion of the drift region to form a controllable channel between the source region and the drift region. A lateral spacing between source active areas of adjacent high-voltage drivers is smaller than a lateral spacing between drift regions of the adjacent high-voltage drivers.

Each of the foregoing embodiments may be employed together with one or more of the following features in any suitable combination: 1. the width dimension of the drift region is sufficiently small to allow portions of the depletion zone to meet, in order to fully deplete free carriers from the drift region. 2. the width dimension of the drift region is less than a width dimension of the source active area. 3. a drain region of the second conductivity type is positioned within the drift region and sufficiently doped to provide an ohmic connection with a drain contact. 4. the drain contact has a width dimension that is greater than a width dimension of the drain region. 5. the width dimension of the drain region is less than the width dimension of the drift region, and the width dimension of the drain contact is greater than the width dimension of the drift region. 6. the gate has a gate contact that overlies the source active area. 7. the source region is also sufficiently doped to provide an ohmic connection with a source contact. 8. a gate oxide that separates the gate from the body and the drift region. 9. an isolator that provides an insulating gap between the gate and the drain region. 10. the isolator includes a trench in the drift region with an oxide fill. 11. a lateral diffusion forming a bridge between the source region and the controllable channel. 12. the first conductivity type is p-type and the second conductivity type is n-type. 13. the first conductivity type is n-type and the second conductivity type is p-type.

It should be understood that the drawings and corresponding detailed description do not limit the disclosure, but on the contrary, they provide the foundation for understanding all modifications, equivalents, and alternatives falling within the scope of the appended claims.

TERMINOLOGY

In the following description, the terms "intrinsic", "lightly-doped", "moderately-doped", and "heavily-doped", and "degenerate" are employed to indicate relative degrees of doping. These terms are not intended to indicate definitive numerical ranges, but rather to indicate (on a logarithmic scale) approximate ranges whose upper and lower extremes may be allowed to vary by a factor of 4 in either direction. In the context of silicon, the term "intrinsic" indicates a dopant concentration of $10^{14}$ atoms/cm$^3$ or less. "Lightly-doped" indicates a concentration in the range between $10^{14}$ and $10^{16}$ atoms/cm$^3$.

"Moderately-doped" indicates a concentration in the range $10^{16}$ to $10^{18}$ atoms/cm$^3$, inclusive. "Heavily-doped" indicates a concentration in the range $10^{18}$ to $10^{20}$ atoms/cm$^3$. "Degenerate" indicates a doping level sufficient to provide an ohmic (non-rectifying) connection with a metal contact (generally greater than $10^{20}$ atoms/cm$^3$). Note that for semiconductors other than silicon, these ranges may vary.

DETAILED DESCRIPTION

Figure 1:
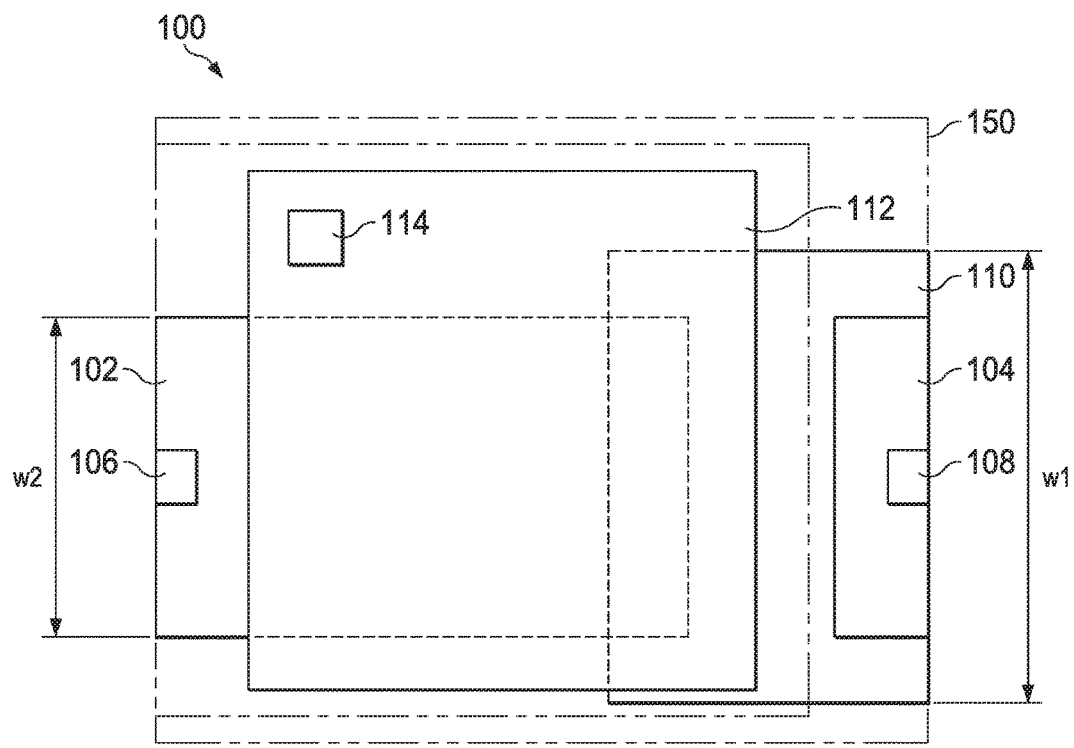
FIG. 1 shows a plan view of a layout of a high-voltage MOSFET device.

FIG. 1 shows a plan view of a layout of a high-voltage MOSFET device 100. The high-voltage MOSFET device 100 includes an active area 102, an active area 104, and a gate 112. The active area 102 (or source active area) corresponds to a source region. For example, the source region is at the active area 102. The source region provides an ohmic connection with a source contact 106 and serves as a source of charge carriers for the channel when the device is in a conducting state. The active area 104 (or drain active area) corresponds to a drain region. For example, the drain region is at the active area 104. The drain region receives the charge carriers from the channel and provides an ohmic connection with a drain contact 108. The active area 104 is surrounded by a lightly-doped drift region 110.

At active areas 102 and 104, a thinner oxide is located at the surface (e.g., at the silicon surface). This thinner oxide is also referred to as a gate oxide. Outside the active areas 102 and 104 (e.g., at the field areas), a thicker oxide (also referred to as a field oxide) is located at the surface. The thinner oxide at the active areas 102 and 104 enables an electrical field from a conductor (e.g., gate 112) to attract charge carriers in a substrate (e.g., to form a channel or a higher concentration of charge carriers). In contrast, the field oxide is sufficiently thick to prevent electrical fields (e.g., from overlying conductors) from influencing the charge carriers of the substrate.

A body 150 extends below the gate 112 between the active areas 102 and 104. When formed, the channel is on a surface of the body 150. The channel corresponds to an overlap between the gate 112 and the active area 102, excluding the drift region 110. When unaffected by the gate 112, the body 150 is a semiconductor of a first conductivity type. The source region and the drain region are semiconductors of a second type. The drift region 110 is a lightly-doped semiconductor that is also of the second type. For example, if the body 150 is a p-type semiconductor, then the source region and the drain region are n-type semiconductors, and the drift region 110 is a lightly-doped n-type semiconductor. As another example, if the body 150 is an n-type semiconductor, then the source region and the drain region are p-type semiconductors, and the drift region 110 is a lightly-doped p-type semiconductor.

The gate 112 overlies the body 150 and at least a portion of the drift region 110. The gate 112 includes an ohmic connection with a gate contact 114. The gate 112 serves to form a controllable channel in the body 150. As noted earlier, the controllable channel corresponds to an overlap between the gate 112 and the active area 102, excluding the drift region 110. In more detail—assuming that the source contact 106 is coupled to ground, a positive voltage applied (e.g., via the gate contact 114) to the gate 112 creates a conduction channel that supports drain-to-source current flow. In an LDMOS, the drain-to-source current flow occurs on the surfaces of the active areas 102 and 104. When the gate voltage is below the threshold voltage, the conduction channel disappears. In this situation, a drain-to-source voltage difference develops. The p-n interface between the body 150 and the drift region 110 becomes reverse-biased, creating a wide depletion region, enabling the device 100 to withstand a large drain-to-source voltage without breaking down.

As illustrated in FIG. 1, a width dimension of the drift region 110 (w1) is greater than the width dimension of the active area 102 (w2) to accommodate the wide depletion region in a lateral direction. As such, the drift region 110 expands beyond the width of the active area 102 and extends the effective width of the device, imposing undesirable spacing requirements from other such devices. Moreover, the drain-to-source voltages that can be withstood may only be as large as 12V to 15V. While voltages in such a range may be sufficient for applications such as logic EEPROMs, the voltages may be insufficient for other applications such as higher density EEPROMs. When LDMOS devices are used, for example, to provide power to cells of a memory device (e.g., an EEPROM device), multiple LDMOS devices are arranged along a side of a memory array. In such a configuration, the width of the drift regions (see, e.g., drift region 110) significantly affects the pitch of the LDMOS devices themselves. For example, the pitch of adjacent LDMOS devices may be larger than the pitch of an EEPROM having high-density bitcells. As a result, LDMOS devices such as the device 100 may be incompatible with memory devices having a relatively small pitch (e.g., Embedded High Density Embedded Memory, such as EEPROM or Flash Memory).

According to at least one embodiment proposed below, the width of the drift region is configured to be relatively narrow. For example, in at least some embodiments, the width of the drift region is less than the width of the active area corresponding to the source. A breakdown voltage sufficient for particular applications (e.g., higher density EEPROMs) is achieved. In addition, reducing the width of the drift region leads to a reduction in the size of the LDMOS device itself. When such LDMOS devices are used to provide power to cells of a memory device, the pitch of the LDMOS devices may be brought closer to the pitch of the bitcells that are driven by the LDMOS devices. Such a reduction in size may aid in reducing the cost of embedding the memory in a CMOS platform.

Figure 2:
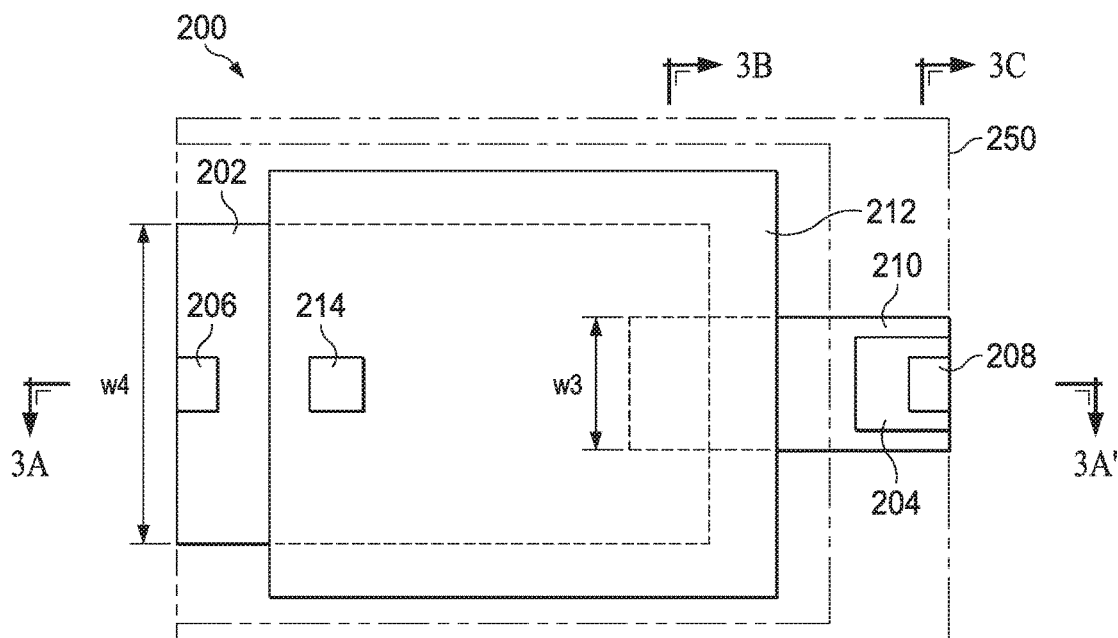
FIG. 2 shows a plan view of a layout of a high-voltage MOSFET device according to at least one embodiment.

FIG. 2 shows a plan view of a layout of a high-voltage MOSFET device 200 according to at least one embodiment. The high-voltage MOSFET device 200 includes an active area 202, an active area 204, and a gate 212. The active area 202 (or source active area) corresponds to a source region (see, e.g., source region 302 of FIG. 3A). For example, the source region is at the active area 202. The source region provides an ohmic connection with a source contact 206. The active area 204 (or drain active area) corresponds to a drain region (see, e.g., drain region 314 of FIG. 3A). For example, the drain region is at the active area 204. The drain region provides an ohmic connection with a drain contact 208. The active area 204 is in a surrounding drift region 210.

At active areas 202 and 204, a thinner oxide is located at the surface (e.g., at the silicon surface). This thinner oxide is also referred to as a gate oxide. Outside the active areas 202 and 204 (e.g., at the field areas), a thicker oxide (also referred to as a field oxide) is located at the surface. The thinner oxide at the active areas 202 and 204 enables an electrical field from a conductor (e.g., gate 212) to attract charge carriers in a substrate (e.g., to form a channel or a higher concentration of charge carriers). In contrast, the field oxide is sufficiently thick to prevent electrical fields (e.g., from overlying conductors) from influencing the charge carriers of the substrate.

A body 250 extends below the gate 212 between the active areas 202 and 204. When formed, the channel is on a surface of the body 250. The channel corresponds to an overlap between the gate 212 and the active area 202, excluding the drift region 210. When unaffected by the gate 212, the body 250 is a semiconductor of a first conductivity type. The source region and the drain regions are semiconductors of a second type. The drift region 210 is a lightly-doped semiconductor that is also of the second type. For example, if the body 250 is a p-type semiconductor, then the source region and the drain region are n-type semiconductors, and the drift region 210 is a lightly-doped n-type semiconductor. As another example, if the body 250 is an n-type semiconductor, then the source region and the drain region are p-type semiconductors, and the drift region 210 is a lightly-doped p-type semiconductor.

The gate 212 overlies the body 250 and at least a portion of the drift region 210. The gate 212 includes an ohmic connection with a gate contact 214. The gate 212 serves to form a controllable channel in the body 250. As noted earlier, the controllable channel corresponds to an overlap between the gate 212 and the active area 202, excluding the drift region 210. In more detail—assuming that the source contact 206 is coupled to ground, a positive voltage applied (e.g., via the gate contact 214) to the gate 212 creates an n-type conduction channel that supports drain-to-source current flow between active areas 202 and 204. When the gate voltage is below the threshold voltage, the conduction channel disappears. In this situation, a drain-to-source voltage difference develops. The p-n interface between the body 250 and the drift region 210 becomes reverse-biased, creating a depletion region, enabling the device 200 to withstand a large drain-to-source voltage without breaking down.

In the high-voltage MOSFET device 100 of FIG. 1, w1 (the width dimension of the drift region 110) is greater than w2 (the width dimension of the active area 102). According to at least one embodiment, the drift region 210 is formed to be more narrow. The narrower drift region 210 enables the depletion layer to extend fully across the width of the drift region when the p-n interface is reverse biased, removing carriers from this region and providing a lateral RESURF (reduced surface field) effect, thereby raising the breakdown voltage of device 200 (e.g., to a voltage of approximately 25V). For example, in at least one particular embodiment, the width of the drift region 210 is reduced to that which is allowed by the fabrication process (e.g., lithography).

FIG. 2 illustrates an example of the narrower drift region 210. In the example of FIG. 2, the drift region 210 is formed to be more narrow such that the width dimension of the drift region 210 (w3) is less than the width dimension of the active area 202 (w4).

The relatively narrow width of the drift region 210 and other features will be described in more detail with reference to the cross-sectional view(s) of FIGS. 3A, 3B and/or 3C.

Figure 3A:
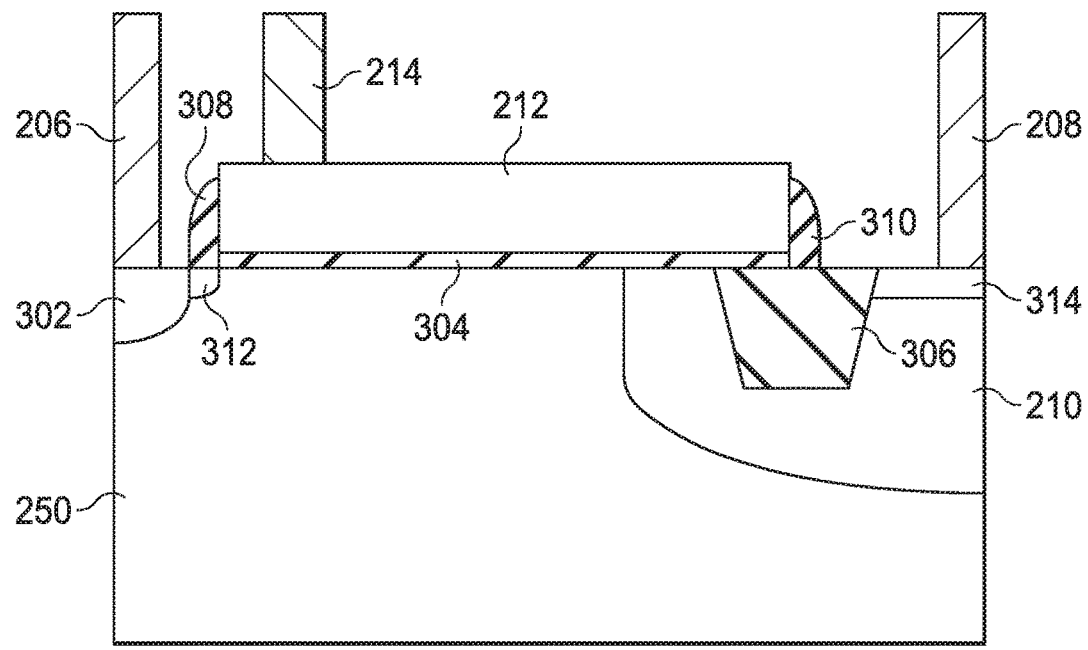
FIGS. 3A, 3B and 3C are cross-sectional views of an illustrative high-voltage MOSFET device.

Line 3A-3A' of FIG. 2 indicates the region of the cross-sectional view shown in FIG. 3A. With reference to FIG. 3A, a source region 302 is adjacent the source contact 206. In at least one embodiment, the source region 302 is sufficiently doped to provide an ohmic connection with the source contact 206. The source region 302 is positioned within a well formed by the body 250. The source region 302 is positioned adjacent to the gate 212.

A lateral diffusion 312 is located between the source region 302 and the body 250. When a conduction channel is created in the body 250, the lateral diffusion 312 forms a conducting bridge between the source region 302 and the controllable channel.

As noted earlier with reference to FIG. 2, the gate 212 overlies the body 250 and at least a portion of the drift region 210. The gate 212 provides an ohmic connection with the gate contact 214. In at least one embodiment, the gate contact 214 overlies the active area 202 to provide a further reduction of the device width.

Gate oxide 304 separates the gate 212 from the body 250 and the drift region 210. When the controllable channel is off, the interface between the body 250 and the drift region 210 forms a depletion zone with a reverse-biased PN junction. An isolator 306 is located between the gate oxide 304 and the body 250. The isolator 306 provides an insulating gap between the gate 212 and the body 250. As illustrated in FIG. 3A, the isolator 306 includes a trench in the drift region 210 with an oxide fill. Insulating end caps 308 and 310 are provided at opposite ends of the gate 212.

The drift region 210 and a drain region 314 are positioned within the well formed by the body 250. For example, the drain region 314 is positioned within the drift region 210. The drain region 314 is of the same conductivity type as the source region 302, and is sufficiently doped to provide an ohmic connection with the drain contact 208. Accordingly, the drain of the device 200 has the lightly-doped drift region electrically connecting the conductive channel to the drain contact 208.

In at least one embodiment, the width dimension of the drift region 210 is sufficiently small for the depletion zone to extend across a full width of the drift region. As such, the width of the drift region 210 is configured such that the drift diffusion can be fully depleted, in order to provide a higher breakdown voltage. For example, when the drift region 210 is sufficiently narrow, then the PN junctions are running vertically. When the PN junctions meet in the middle, then the depletion can occur more fully.

With continued reference to FIG. 3A, the drain of the illustrated device 200 lacks a Source/Drain (SD) diffusion that is typically provided to form a resistive connection between the drain contact 208 to the drain diffusion. A standard SD diffusion could provide a distributed carrier concentration that is too high for the desired high breakdown voltage. Instead, in at least one embodiment, the drain connection region 314 is formed as part of the shallower, lighter lateral dopant diffusion (LDD) step used to form the LDD bridge 312.

The narrower width of the drift region 210 will continue to be described with reference to FIG. 3B. Line 3B-3B' of FIG. 2 indicates the region of the cross-sectional view shown in FIG. 3B.

Figure 3B:
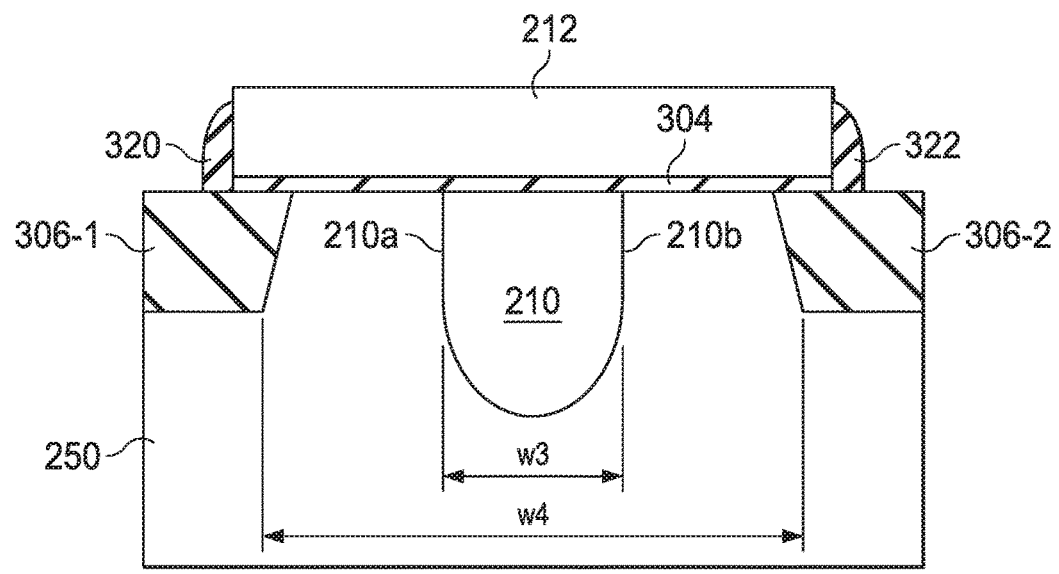

With reference to FIG. 3B, insulating end caps 320 and 322 are provided at opposite ends of the gate 212. In an area between the field oxide 306-1 and the field oxide 306-2, the width of the drift region 210 (w5) is less than the width of the active area 202 (w6). Due to the narrowness of the drift region 210, the depletion zones extending from both sides (see, e.g., sides 210a, 210b) of the drift region 210 can meet in the middle to fully deplete the free carriers from the drift region. To achieve this desirable effect, the width of the drift region 210 is based at least partially on the degree of doping in the drift region.

Figure 3C:
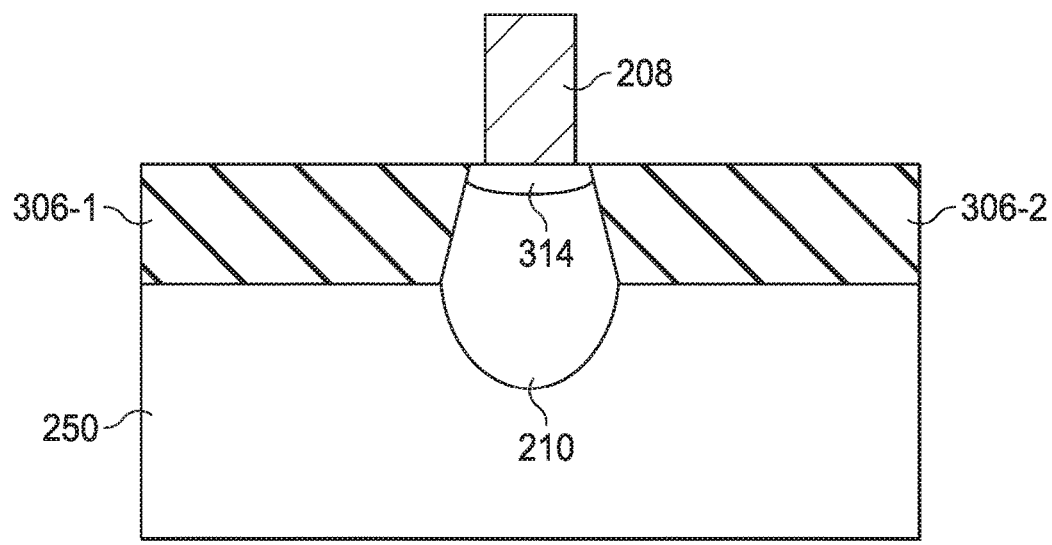

Line 3C-3C of FIG. 2 indicates the region of the cross-sectional view shown in FIG. 3C. As illustrated in FIG. 3C, in at least one embodiment, the width dimension of the drain region 314 is less than the width dimension of the drift region 210. Further, in at least one embodiment, the width dimension of the drain contact 208 is less than the width dimension of the drain region 314. This configuration may produce an undesirably high drain contact impedance.

Figure 4:
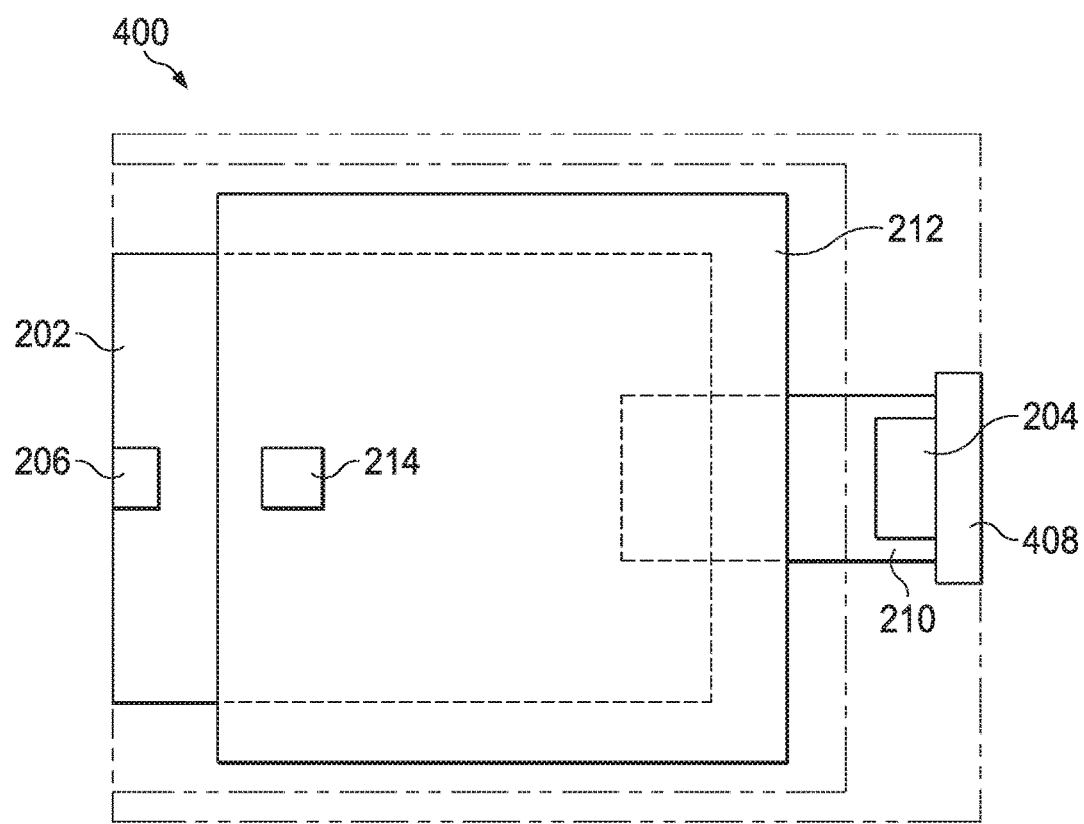
FIG. 4 shows a plan view of a layout of a high-voltage MOSFET device 400 according to at least one embodiment.

In at least one other embodiment, the width dimension of the drain contact 208 is greater than the width dimension of the active area 204, and may even be greater than the width of the drift region 210. FIG. 4 shows a plan view of a layout of a high-voltage MOSFET device 400 according to an example of such an embodiment.

In the example of FIG. 4, drain contact 408 has a width dimension that is greater than a width dimension of the active area 204. In addition, the width of the drain contact 408 is larger than the width of the drift region 210. A drain contact configured in this manner facilitates better control of a drain resistance. Also, the use of a wider (or elongated) drain contact 408 may aid in reducing potential variations caused by misalignment of the drain contact 408 to the active area 204.

Figure 5:
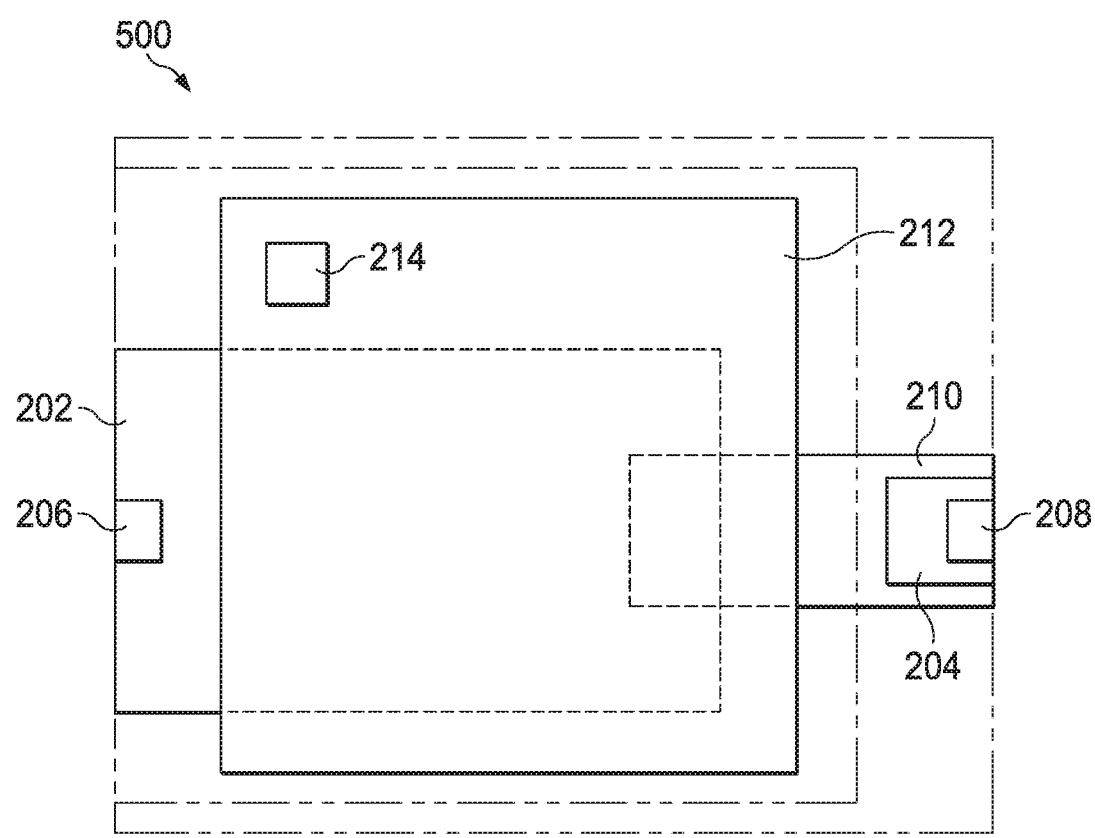
FIG. 5 is a plan view of a layout of a high-voltage MOSFET device 500 according to at least one embodiment.

FIG. 5 is a plan view of a layout of a high-voltage MOSFET device 500 according to at least one embodiment. The MOSFET device 500 is similar to the MOSFET device 200 described earlier with reference to FIG. 2. One difference between the MOSFET devices 500, 200 resides in the positioning of the gate contact (e.g., gate contact 214). In the MOSFET device 200, the gate contact 214 is positioned to overlie the active area 202, excluding the drift region 210. As such, the gate contact 214 is placed over the controllable channel. This aids in reducing the size of the device 200, in that a lateral displacement of the gate contact 214 with respect to the active area 202 might add width overhead. However, in some situations (e.g., when size reduction of the MOSFET device need not be as large), the gate contact may be positioned such that it does not overlie the active area 202. For example, the gate contact 214 may be positioned laterally away from the active area 202, as illustrated in FIG. 5.

Figure 6:
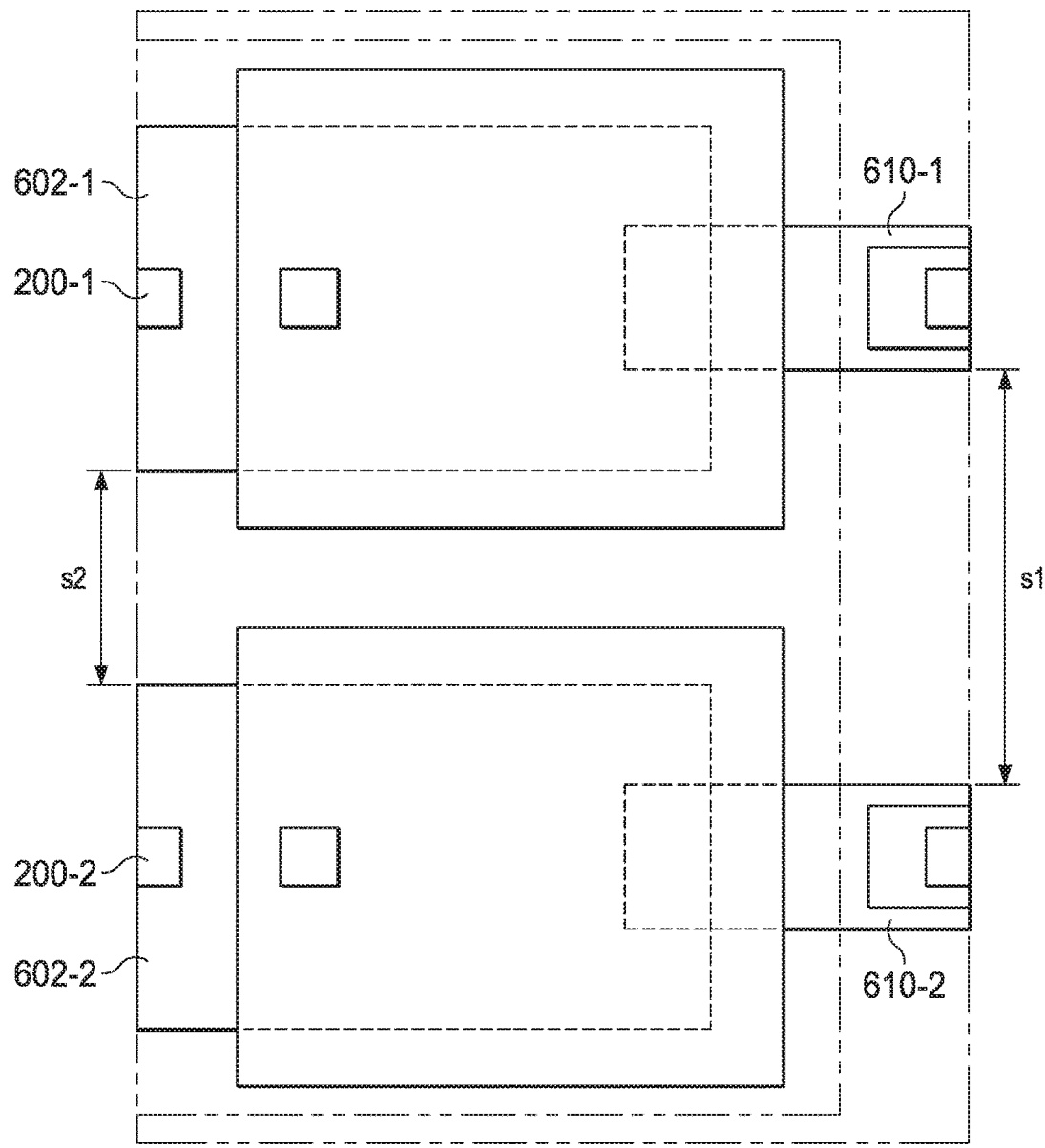
FIG. 6 is a plan view of a layout of an array of high-voltage MOSFET devices according to at least one embodiment.

FIG. 6 is a plan view of a layout of an array of high-voltage MOSFET devices 600-1, 600-2 according to at least one embodiment. The devices 600-1, 600-2 may each be similar to the MOSFET device 200 of FIG. 2. Alternatively, the devices 600-1, 600-2 may each be similar to the MOSFET device 400 of FIG. 4 (or MOSFET device 500 of FIG. 5). In the example of FIG. 6, two high-voltage drivers are illustrated for purposes of simplicity. However, it is understood that the number of high-voltages may be greater than 2.

In at least one embodiment, the array of MOSFET devices 600-1, 600-2 is arranged along one side of a memory array (e.g., an EEPROM memory array). In this situation, the MOSFET devices 600-1, 600-2 may be arranged at no more than twice the pitch of memory cells in the memory array. Drift regions 610-1, 610-2 of the respective MOSFET devices 600-1, 600-2 are spaced apart by a lateral spacing s1. Similarly, active areas 602-1, 602-2 of the respective MOSFET devices 600-1, 600-2 are spaced apart by a lateral spacing s2. Reducing the width of the drift regions (e.g., as described earlier with reference to various embodiments) aids in reducing the pitch of the MOSFET devices 600-1, 600-2 in the array of these devices. Furthermore, with the reduction in the width of the drift regions, the lateral spacing s2 becomes smaller than the lateral spacing s1. As such, the MOSFET devices 600-1, 600-2 may be positioned closer to each other, while still keeping the lateral spacing s1 larger than a particular value (or threshold). Accordingly, the pitch of the MOSFET devices 600-1, 600-2 may more closely approximate the pitch of memory cells in a memory array (e.g., EEPROM cells in a high-density array).

The foregoing description has presumed the use of silicon as the semiconducting material, but one of ordinary skill will recognize that the foregoing approach may also be employed with other semiconducting materials such as carbon, germanium, and gallium-arsenide.

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A high-voltage MOSFET device that comprises:
a body being a semiconductor of a first conductivity type;
a source region at a source active area and positioned within or adjacent to the body, the source region being a semiconductor of a second conductivity type;
a drift region being a lightly-doped semiconductor of the second conductivity type, the drift region positioned adjacent to the body;
a drain region of the second conductivity type positioned within the drift region and sufficiently doped to provide an ohmic connection with a drain contact, the drain contact having a width dimension that is greater than a width dimension of the drain region; and
a gate overlying at least a portion of the body and at least a portion of the drift region to form a controllable channel between the source region and the drift region,
wherein the portion of the drift region overlaid by the gate is bordered by semiconducting material forming a depletion zone with a reverse-biased PN junction when the controllable channel is off, and
wherein a width dimension of the drift region is sufficiently small for the depletion zone to extend across a full width of the drift region.

2. The high-voltage MOSFET device of claim 1, wherein the width dimension of the drift region is less than a width dimension of the source active area.

3. The high-voltage MOSFET device of claim 1, wherein the width dimension of the drain region is less than the width dimension of the drift region, and wherein the width dimension of the drain contact is greater than the width dimension of the drift region.

4. The high-voltage MOSFET device of claim 1, wherein the gate has a gate contact that overlies the channel.

5. The high-voltage MOSFET device of claim 1, further comprising:
a drain region of the second conductivity type positioned within the drift region and sufficiently doped to provide an ohmic connection with a drain contact; and
a gate oxide that separates the gate from the body and the drift region;
an isolator that provides an insulating gap between the gate and the drain region, wherein the isolator comprises a trench in the drift region with an oxide fill; and
a lateral diffusion forming a bridge between the source region and the controllable channel,
wherein the source region is sufficiently doped to provide an ohmic connection with a source contact.

6. The high-voltage MOSFET device of claim 1, wherein the first conductivity type is p-type and the second conductivity type is n-type.

7. The high-voltage MOSFET device of claim 1, wherein the first conductivity type is n-type and the second conductivity type is p-type.

8. A memory device with high-voltage drivers, the memory device comprising:
a memory array having a cell pitch;
a side-by-side array of high-voltage drivers arranged along one side of the memory array at no more than twice the cell pitch, each of the high-voltage drivers comprising, in a semiconductor bulk of a first conductivity type:
a moderately-doped area of the first conductivity type to serve as a body;
a source region at a source active area, the source region being a semiconductor of a second conductivity type and positioned within or adjacent to the body;
a drift region being a lightly-doped semiconductor of the second conductivity type, the drift region positioned adjacent to the body; and
a gate overlying at least a portion of the body and at least a portion of the drift region to form a controllable channel between the source region and the drift region,
wherein a lateral spacing between source active areas of adjacent high-voltage drivers is smaller than a lateral spacing between drift regions of the adjacent high-voltage drivers.

9. The memory device of claim 8, wherein in each of the high-voltage drivers:
the portion of the drift region overlaid by the gate is bordered by semiconducting material forming a depletion zone with a reverse-biased PN junction when the controllable channel is off; and
the width dimension of the drift region is sufficiently small for the depletion zone to extend across a full width of the drift region.

10. The memory device of claim 8, wherein each of the high-voltage drivers further comprises:
a drain region of the second conductivity type positioned within the drift region and sufficiently doped to provide an ohmic connection with a drain contact.

11. The memory device of claim 10, wherein, in each of the high-voltage drivers, the drain contact has a width dimension that is greater than a width dimension of the drain region.

12. The memory device of claim 11, wherein in each of the high-voltage drivers:
the width dimension of the drain region is less than the width dimension of the drift region; and
the width dimension of the drain contact is greater than the width dimension of the drift region.

13. The memory device of claim 8, wherein, in each of the high-voltage drivers, the gate has a gate contact that overlies the channel region.

14. The memory device of claim 8, wherein each of the high-voltage drivers further comprises:
a drain region of the second conductivity type positioned within the drift region and sufficiently doped to provide an ohmic connection with a drain contact;
a gate oxide that separates the gate from the body and the drift region;
an isolator that provides an insulating gap between the gate and the drain region, wherein the isolator comprises a trench in the drift region with an oxide fill; and
a lateral diffusion forming a bridge between the source region and the controllable channel,
wherein the source region is sufficiently doped to provide an ohmic connection with a source contact.

15. The memory device of claim 8, wherein the first conductivity type is p-type and the second conductivity type is n-type.

16. The memory device of claim 8, wherein the first conductivity type is n-type and the second conductivity type is p-type.

* * * * *